United States Patent [19]

Okada et al.

[11] Patent Number: 5,308,969
[45] Date of Patent: May 3, 1994

[54] IMAGE SENSOR

[75] Inventors: Junji Okada; Hiroshi Fujimagari, both of Kanagawa, Japan

[73] Assignee: Fuji Xerox Co., Ltd., Tokyo, Japan

[21] Appl. No.: 957,003

[22] Filed: Oct. 6, 1992

[30] Foreign Application Priority Data

Oct. 15, 1991 [JP] Japan .................................. 3-266091

[51] Int. Cl.$^5$ ............................................. H01J 40/14
[52] U.S. Cl. ..................................... 250/208.1; 257/53
[58] Field of Search ............... 250/208.1, 214.1, 578.1; 257/53, 184

[56] References Cited

U.S. PATENT DOCUMENTS 4,784,702 11/1988 Henri ..................................... 257/184
4,945,243 7/1990 Arques ............................. 250/578.1
5,093,727 3/1992 Kakinuma et al. ................ 250/208.1

Primary Examiner—David C. Nelms
Attorney, Agent, or Firm—Finnegan, Henderson, Farabow, Garrett & Dunner

[57] ABSTRACT

An image sensor is provided with a plurality of photodiodes each having a better forward-current responsiveness and a smaller dark current in the reverse direction. Each of the photodiodes includes a two-layered photoelectric conversion layer made of non-doped hydrogenated amorphous silicon. One of these two layers, which has an interface that prevents electrons from escaping when photogenerated electric charge is stored, is deposited at a lower temperature than the other. The photodiodes are arranged in rows on a transparent electrode. The photodiodes operate in pairs, each pair corresponding to one picture element and having a first photodiode connected to a second photodiode in series, with opposite polarity. All the first photodiodes are connected to a detecting circuit and all the second photodiodes are connected to a pulse generating circuit.

5 Claims, 6 Drawing Sheets

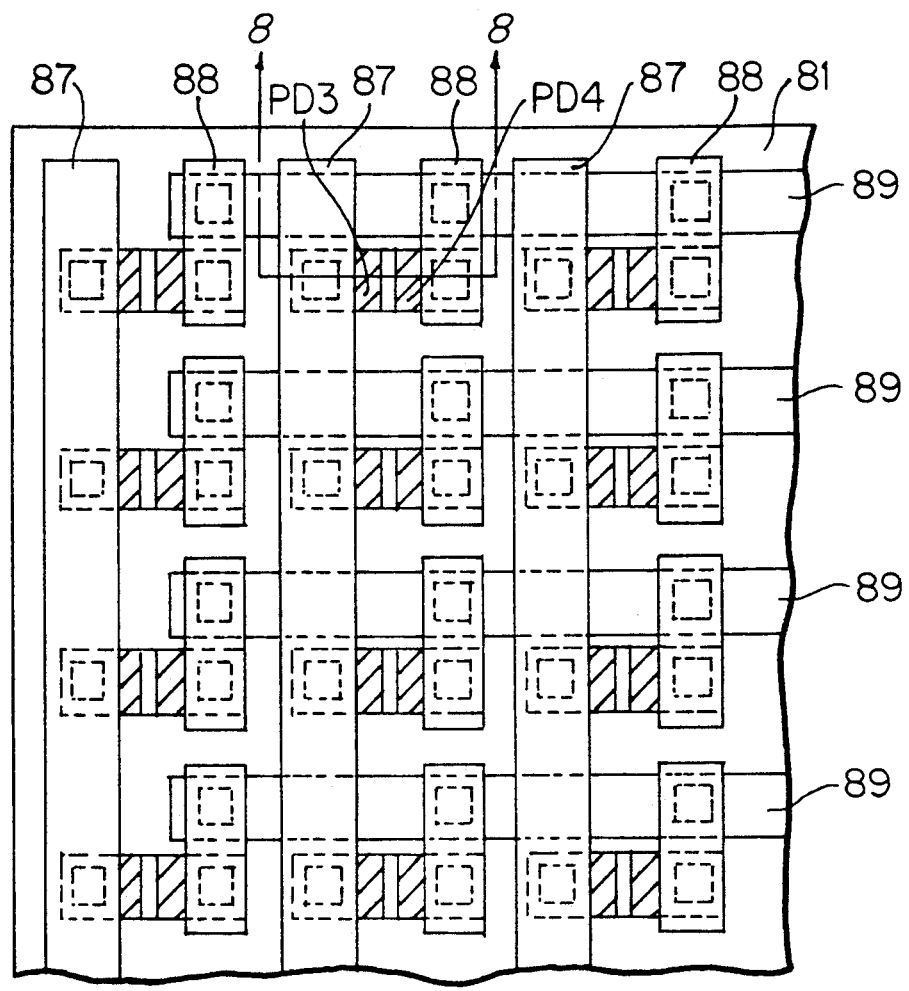
FIG. 9
*(PRIOR ART)*
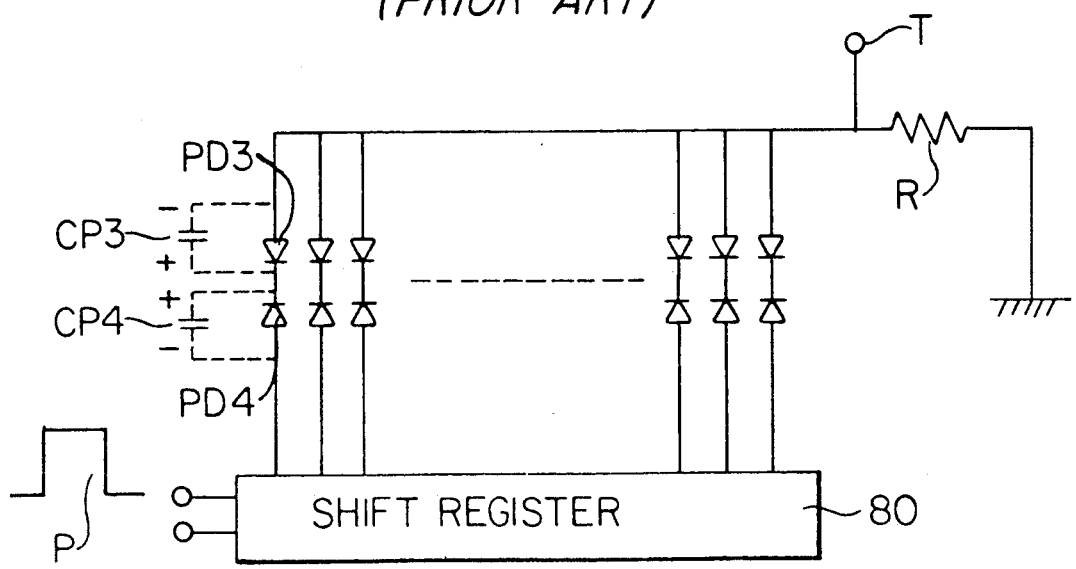
FIG. 10 *(PRIOR ART)*

IMAGE SENSOR

FIELD OF THE INVENTION

This invention relates to an image sensor used for an image input device in a copier, a facsimile machine, or the like, and particularly to an image sensor which includes a plurality of photoreceptor elements arranged in rows, each of the photoreceptor elements consisting of two photodiodes connected to each other in series, with opposite polarity (hereinafter "in series-opposition").

BACKGROUND OF THE INVENTION

A typical image sensor incorporates a number of photodiodes aligned in the fast scan direction and a number of electrodes for extracting electric charge from the photodiodes, which in consequence involves a complicated wiring configuration. Japanese Patent Laid Open No. Sho 59-147148 (1984), for example, discloses an image sensor having a comparatively simple wiring configuration with fewer electrodes than photodiodes. FIG. 7 shows an one-dimensional image sensor having a number of photoreceptor elements aligned in the fast scan direction, including a plurality of photodiodes 71 divided into n groups Gi (i=1 to n), each group consisting of m photodiodes 71 having their cathodes jointly connected to a corresponding transistor 73. There are thus n transistors 73, which are connected to an common output terminal T and to a reverse bias circuit including a reverse bias power supply 75 and a load resistance 76 connected in series. The gate electrodes of the n transistors 73 are connected to a group-selector shift register 77. The image sensor also includes a plurality of blocking diodes 72 of conventional configuration, connected one to each of the photodiodes 71 in series-opposition; that is, each blocking diode 72 has its anode connected to the anode of the corresponding photodiode 71. The cathodes of the blocking diodes 72 are connected with one another in such a manner that the leftmost blocking diode in a given block is connected with the leftmost blocking diodes in all the other blocks, the second leftmost blocking diode in a given block is connected together with the other second leftmost blocking diodes, and so on, thereby forming m sets of connections. M transistors 74 are also provided in the image sensor, which have first ends connected to corresponding sets of connections, second ends connected to the above-mentioned reverse bias circuit, and their gate electrodes connected to a group-selector shift register 78.

This configuration requires fewer wiring conductors, since the shift register 77 sequentially transmits selecting pulses to the gate electrodes of the n transistors 73, to energize the corresponding groups Gi (i=1 to n) in turn, while the shift register 78 sequentially transmits selecting pulses to the gate electrodes of the m transistors 74, to render the related diodes conductive. M+n transistors the therefore required to extract image information from all the photodiodes in the image sensor, resulting in wiring conductors reduced.

In the operation of the image sensor, the shift register 77 transmits a pulse to the gate electrode of the leftmost transistor 73 for example, at the same time the shift register 78 transmits a pulse to the gate electrode of the leftmost transistor 74. This makes the leftmost photodiode 71A and its series-connected blocking diode 72A in the G1 group electrically connected to the reverse bias circuit, to cause the leftmost photodiode 71A in the G1 group to send its output to the output terminal T. The shift register 78 then transmits another pulse to the gate electrode of the second leftmost transistor 74, to cause the second leftmost photodiode 71B in the G1 group to send its output to the output terminal T. In this manner, while group G1 is energized by the shift register 77, the shift register 78 activates the m transistors 74 in turns, to obtain the all image information produced in group G1.

Without blocking diodes 72, circulating currents as indicated by a dashed line in FIG. 7 would occur, in which a circulating current starts at the photodiode 71B and flows into the wiring conductor connected to the photodiode 71A. Even if the photodiode 71A reads a black portion of the original, the output value of the photodiode 71A cannot be zero because the photodiode 71A receives circulating currents from other photodiodes such as the photodiode 71B. For this reason, the blocking diodes 72 are provided, connected one to each of the photodiodes 71 in series-opposition so as to prevent circulating currents.

Japanese Patent Laid Open No. Hei. 3-209767 (1991) discloses a two-dimensional image sensor having a plurality of photodiodes in pairs and a single shift register. A pulse from the single shift register causes each photodiode in turn to be charged and to provide an output simultaneously. This type of image sensor will now be described referring to FIGS. 8, 9, and 10. FIG. 8 is a cross-sectional view of a pair of photodiodes of the image sensor, taken along line B—B in FIG. 9. FIG. 9 is a plan view of the image sensor illustrating pairs of photodiodes arranged in three lines. FIG. 10 is a circuit diagram of the image sensor.

The image sensor as shown in FIG. 8 has a photodiode PD3 and a blocking photodiode PD4, which have a common lower electrode 82 of chromium (Cr) formed on an electrode 81, photoelectric conversion layers 83A and 83B of hydrogenated amorphous silicon (a-Si:H) placed apart side by side on the lower electrode 82, and transparent upper electrodes 84A and 84B on the photoelectric conversion elements 83A and 83B respectively. The image sensor further includes an insulating layer 85 for covering the upper electrodes 84A and 84B and the remaining portions of the transparent substrate 81 not underlying the upper electrodes 84A and 84B. Formed on the insulating layer 85 are signal lines 87 and 88, which electrically contact to the upper electrodes 84A and 84B through openings 86A and 86B respectively, the openings formed in the insulating layer 85. The numeral, 90, in the figure denotes light from an image-bearing original.

The photodiodes PD3 and PD4 are connected to each other in series-opposition, to form a pair corresponding to one picture element. The pairs of photodiodes are arranged two-dimensionally in three rows on the transparent electrode 81 as shown in FIG. 9. Each of the signal lines 87 assigned to a row of photodiodes PD3 is connected to a detecting circuit including a load resistance R and an output terminal T as shown in FIG. 10. The signal lines 88 connect each of the photodiodes PD4 to its corresponding signal line 89, and the signal lines 89 connect to a shift register 80.

The image sensor operates as follows. Referring to FIG. 10, the shift register 80 sequentially transmits activating pulse voltages P to the pairs of photodiodes PD3 and PD4, to cause the photodiodes PD4 to be forward-biased and the photodiodes PD3 to be reverse-biased.

The reverse-biased photodiode PD3 has its capacitance CP3 charged in the polarity shown in the figure. After the end of each transmission, the electric charge in the capacitance CP3 is distributed to the capacitance CP4 of the photodiode PD4 and stored therein in the polarity shown in the figure. Then the photodiodes PD3 and PD4 receive light from the original, and photogenerated currents flow according to the quantity of the light received. The photogenerated currents cause the capacitance CP3 and CP4 to discharge. The shift register 80 then transmits secondary pulse voltages to the pairs of photodiodes PD3 and PD4 in turn in the same manner as above, to cause the previously discharged capacitances CP3 to be charged again. Each charging generates an electric current flow into the load resistor R, the current being detected by the output terminal T.

The thus-configured image sensor has good photoelectric conversion characteristics, but poor responsiveness to the forward current, since the incorporated photodiodes are of Schottky type with a single layer of hydrogenated amorphous silicon formed on an electrode of chromium (Cr). Lower responsiveness to the forward current makes it difficult to saturate the capacitance of the reverse-biased photodiode. Saturation can be accomplished by lengthening the pulse application time period, but this reduces the image sensor driving speed. The difficulty of saturating the capacitance causes residual images, because the capacitances cannot be supplied with electric charge of the same quantity as was lost by discharging.

SUMMARY OF THE INVENTION

In view of the foregoing, an object of the present invention is to provide an image sensor incorporating a photodiode capable of a high speed driving with a better forward-current responsiveness and a smaller dark current in the reverse direction.

An image sensor according to the present invention comprises a plurality of photoreceptor elements arranged in rows on a transparent substrate, each of the photoreceptor elements essentially consisting of a first photodiode and a second photodiode connected to each other in series-opposition, the first photodiode connected to a detecting circuit and the second photodiode connected to a pulse generating circuit. The first photodiode and the second photodiode have layered configurations each including a photoelectric conversion layer consisting of two layers of non-doped hydrogenated amorphous silicon deposited on the transparent substrate. One of these two layers, which is deposited at a lower temperature, has superior reverse current characteristics, enhancing the blocking of electrons from escaping while charge is stored.

The image sensor operates as follows. An activating pulse voltage is applied through the second photodiode to the first photodiode, to cause the first photodiode to be reverse-biased, with the capacitance of the first photodiode charged sufficiently. After the end of the pulse voltage application, the electric charge in the capacitance of the first photodiode is distributed to the capacitance of the second photodiode. These photodiodes are then exposed to light from the original, whereby their capacitances are discharged according to the quantities of the received light. Another activating pulse voltage is then applied through the second photodiode to the first photodiode in the same manner as above, so that the first photodiode is reverse-biased and its capacitance is charged sufficiently again.

An advantage of the image sensor according to the present invention is to sufficiently fill the capacitance of the reverse-biased photodiode with electric charge, which allows high speed operation of the image sensor and also a reduction of residual images. This advantage is accomplished with the photoelectric conversion layer of two-layered configuration. The photoelectric conversion layer has two non-doped amorphous silicon layers, one deposited at a lower temperature than the other and having superior reverse current characteristics enhancing the blocking of electrons from escaping while charge is stored. The thus-configured photoelectric conversion layer increases the forward current flow in the photodiode, which ensure that the capacitance of the reverse-biased photodiode is sufficiently charged.

The two-layered photoelectric conversion layer produces another advantage of the image sensor, a relatively small dark current in the reverse direction, which enables the capacitance of the photodiode to have a smaller dark discharge.

BRIEF DESCRIPTION OF THE DRAWINGS

FIG. 9 is a plan view of the conventional image sensor shown in FIG. 8, in which pairs of photodiodes are arranged in three rows on a transparent substrate; and FIG. 10 is a circuit diagram of the conventional image sensor shown in FIG. 9.

DETAILED DESCRIPTION OF THE PREFERRED EMBODIMENTS

Figure 1:
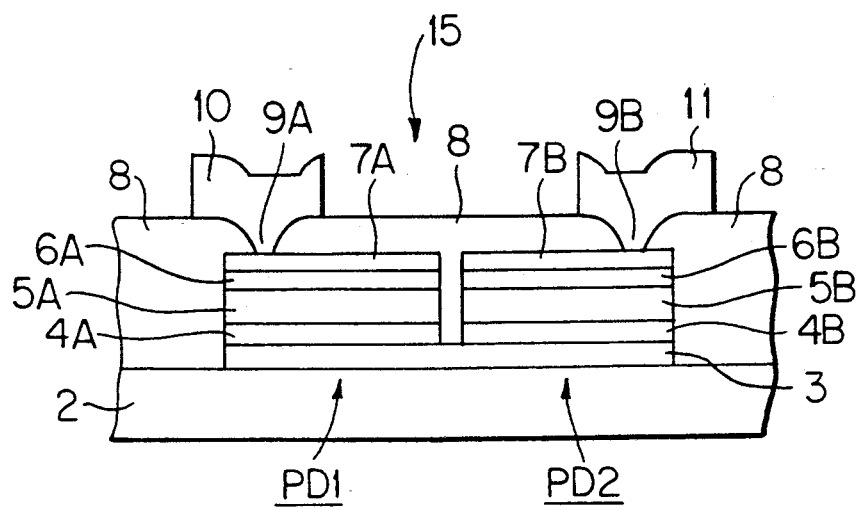
FIG. 1 is a cross-sectional view of a pair of photodiodes connected to each other in series-opposition in a first embodiment of an image sensor according to the present invention.
Figure 2:
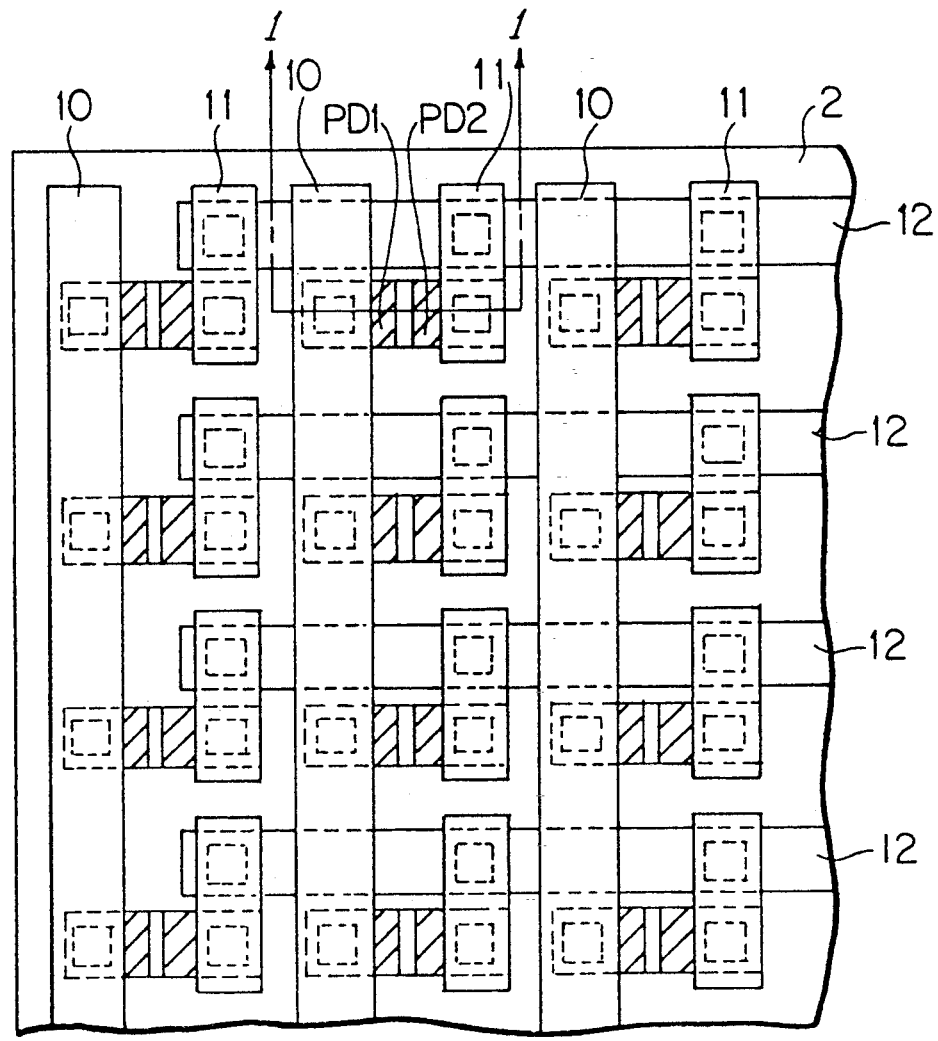
FIG. 2 is a plan view of the image sensor shown in FIG. 1, in which pairs of photodiodes are arranged in three rows on a transparent substrate.

A first embodiment of an image sensor according to the present invention will be described with reference to the accompanying drawings. FIG. 1 illustrates a pair of photodiodes of the first embodiment in cross-sectional view, taken along line A—A in FIG. 2. FIG. 2 is a plan view of the first embodiment illustrating pairs of photodiodes arranged in three rows.

In FIG. 1, the first embodiment of the image sensor comprises an insulating transparent substrate 2 of glass or the like, a metal electrode 3 of chromium (Cr) or the like formed on the transparent substrate 2, n-type doped hydrogenated amorphous silicon layers 4A and 4B serving as ohmic contact layers spaced apart from each other on the metal electrode 3, first non-doped hydrogenated amorphous silicon layers 5A and 5B serving as photoelectric conversion layers formed on the n-type doped hydrogenated amorphous silicon layers 4A and 4B respectively, and second non-doped hydrogenated amorphous silicon layers 6A and 6B formed on the first non-doped hydrogenated amorphous silicon layers 5A and 5B respectively.

The second non-doped hydrogenated amorphous silicon layers 6A and 6B, which has superior reverse current characteristics enhancing the blocking of electron from escaping while charge is stored, are deposited at a lower temperature than the first non-doped hydrogenated amorphous silicon layers 5A and 5B, as will be described later in detail.

The first embodiment of the image sensor further comprises transparent electrodes 7A and 7B of indium tin oxide (ITO) formed on the second non-doped hydrogenated amorphous silicon layers 6A and 6B, an insulating layer 8 of polyimide covering the transparent electrodes 7A and 7B and the remaining portions of the transparent substrate 2 and the metal electrode 3 not underlying the transparent electrodes 7A and 7B, a common signal line 10 formed on the insulating layer 8 above the transparent electrode 7A, and a wiring conductor 11 formed on the insulating layer 8 above the transparent electrode 7B. The insulating layer 8 is provided with openings 9A and 9B to allow electric contacts to be made between the common signal line 10 and the transparent electrode 7A and between the wiring conductor 11 and the transparent electrode 7B respectively. The numeral 15 in the figure denotes light rays from an original.

A method of fabricating the above image sensor will be now described referring to FIGS. 3(A) to 3(E).

Figure 3A:
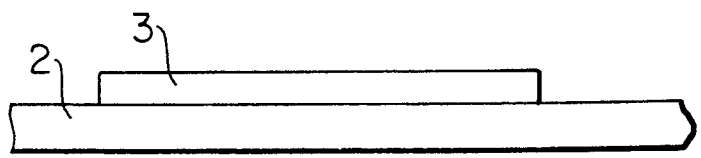
FIGS. 3(A) to 3(E) show the photodiodes of the first embodiment of the image sensor according to the present invention at various stages of fabrication; (A) at the stage after forming a chromium electrode on a transparent substrate, (B) at the stage after forming an n-type doped hydrogenated amorphous silicon layer, a first non-doped hydrogenated amorphous silicon layer, and a second non-doped hydrogenated amorphous silicon layer on the chromium electrode in order, (C) at the stage after forming a transparent metal electrode on the second hydrogenated amorphous silicon layer, (D) at the stage after the photolithographic patterning of the lamination shown in (C), and (E) at the stage after forming an insulating layer, a common signal line, and a wiring conductor.

In FIG. 3(A), a metallic film of chromium (Cr) or the like is deposited to a thickness of approximately 70 nm on the transparent substrate 2 of glass or the like by vapor deposition or sputtering, and then subjected to photolithography to yield the metal electrode 3 and an individual signal line 12 (shown in FIG. 2).

Figure 3B:
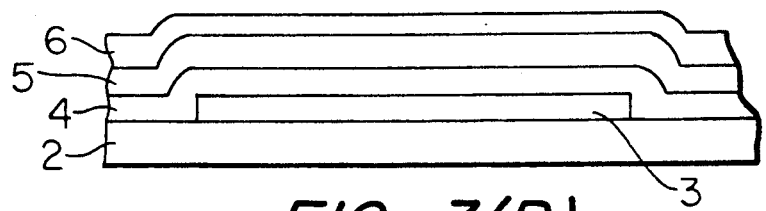

FIG. 3(B) shows how an n-type doped hydrogenated amorphous silicon layer 4 is then deposited to a thickness of no more than 100 nm by plasma CVD (chemical vapor deposition) in a gas mixture of silane ($SiH_4$) and phosphine ($PH_3$) in the proportion 99:1 with the substrate temperature set at 180° C. to 350° C.

The photoelectric conversion layer of the laminated structure is then formed in two continuous chemical reacting chambers at different temperatures. The first non-doped hydrogenated amorphous silicon layer 5 is deposited with the substrate temperature from 230° C. to 350° C., and next second non-doped hydrogenated amorphous silicon layer 6 is deposited with the substrate temperature set at 180° C. to 250° C. and in any event lower than that of the first layer 5. The total thickness of the first layer 5 and the second layer 6 is 0.3 $\mu$m to 2 $\mu$m. The second layer 6 is deposited to a thickness of 0.1 $\mu$m so as to reduce the dark current in the reverse direction, and the first layer 5 is deposited thicker than the second layer 6 so as to increase the forward current flow.

When using a single chemical reacting chamber for depositing the first layer 5 and the second layer 6 consecutively, the first layer deposition is followed by leaving the resulting substrate alone in the chamber until the substrate temperature decreases to an appropriate level for the second layer deposition. Alternatively, the first layer deposition is followed by breaking the vacuum in the chamber to decrease the temperature, and subjecting the resultant substrate to a BHF (buffered hydrofluoric acid) process to remove the oxide film forming on the first layer 5. Thereafter the second layer 6 is deposited.

Figure 3C:
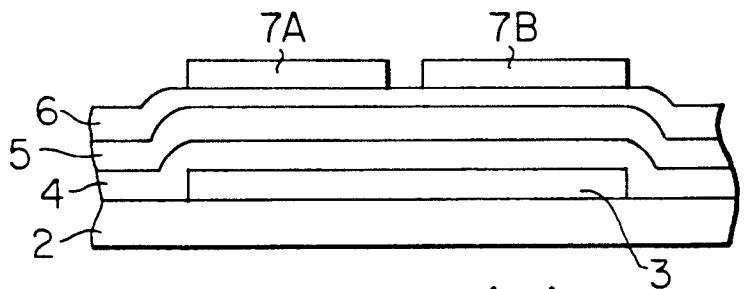

In FIG. 3(C), an indium tin oxide (ITO) layer is then deposited to a thickness of 80 nm by sputtering, which is followed by a photolithography process, to form the transparent electrodes 7A and 7B.

Figure 3D:
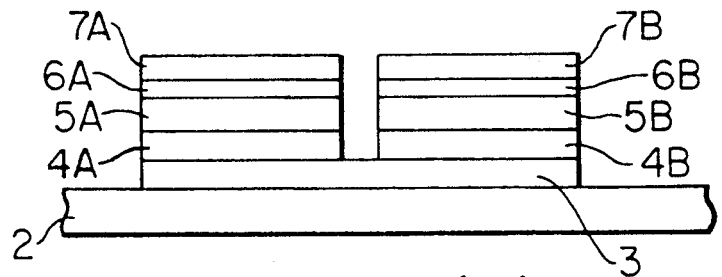

FIG. 3(D) shows how the three previously deposited layers of n-type doped hydrogenated amorphous silicon layer 4, the first non-doped hydrogenated amorphous silicon layer 5 and the second non-doped hydrogenated amorphous silicon layer 6 are simultaneously patterned by dry etching using, for example, carbon tetrafluoride ($CF_4$) or sulfur hexafluoride ($SF_6$), to yield the n-type doped hydrogenated amorphous silicon layers 4A and 4B, the first non-doped hydrogenated amorphous silicon layers 5A and 5B, and the second non-doped hydrogenated amorphous silicon layers 6A and 6B.

Figure 3E:
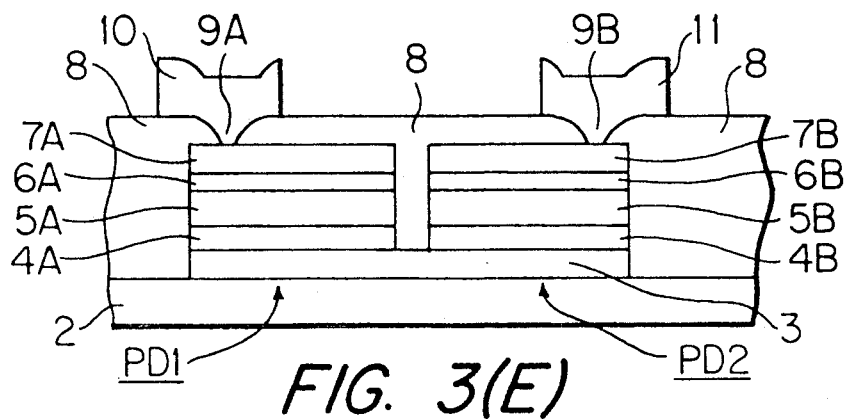

In FIG. 3(E), a polyimide layer 8 (preferably of a material manufactured by Hitachi Chemical Co. Ltd. under the names of PIX-1400 and PIX-8803, or manufactured by Toray Industries Inc. under the name of Photoneece) is formed at a thickness of approximately 1 $\mu$m over the transparent electrodes 7A and 7B, the remaining portions of the substrate 2 and metal electrode 3 not underlying the transparent electrodes 7A and 7B. This layer is formed using a roller coating method in which a rotating roller performs the coating, or a spin coating method in which the substrate is spun while being coated; both methods are well-known in the art. The resulting substrate is then subjected to photolithography to form openings 9A and 9B in the polyimide layer 8.

Finally, a metal such as aluminum (Al) is deposited to a thickness of approximately 1 $\mu$m by vapor deposition or sputtering, which is followed by a photolithography process to yield the common signal line 10 and the wiring conductor 11. Thus, the pair of photodiodes PD1 and PD2 corresponding to one picture element is constructed.

Figure 5:
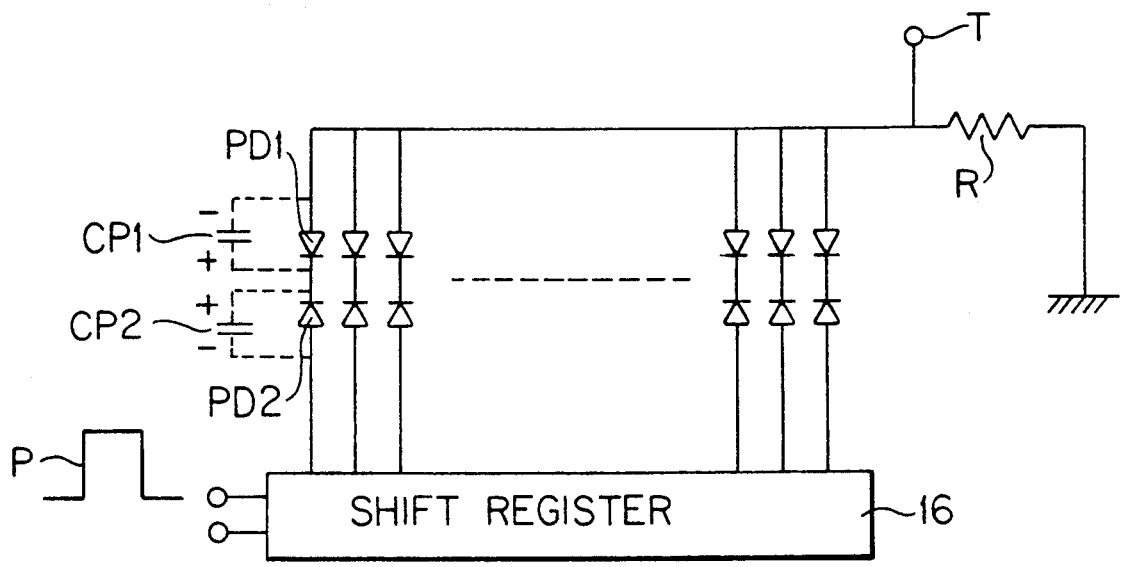
FIG. 5 is a circuit diagram of the first embodiment of the image sensor according to the present invention.

The pairs of photodiodes PD1 and PD2 fabricated in the above process are arranged in three rows as shown in FIG. 2 so as to be exposed to light from an original. As shown in FIG. 5, the photodiodes PD1 are connected by the common signal lines 10 to a detecting circuit including a load resistance R and an output terminal T. The photodiodes PD2 are connected by the wiring conductors 11 and the individual signal lines 12 to a shift register 16.

A description will be made of test results on the foregoing photodiode (the first layer 5 deposited to a thickness of 0.1 μm at a temperature of 250° C., and the second layer 6 deposited to a thickness of 0.4 μm at a temperature of 230° C), in comparison with two other types of photodiode, one having a mono-layered photoelectric conversion layer of hydrogenated amorphous silicon deposited at a temperature of 230° C., the other having a mono-layered photoelectric conversion layer of hydrogenated amorphous silicon at a temperature of 250° C.

Figure 4A:
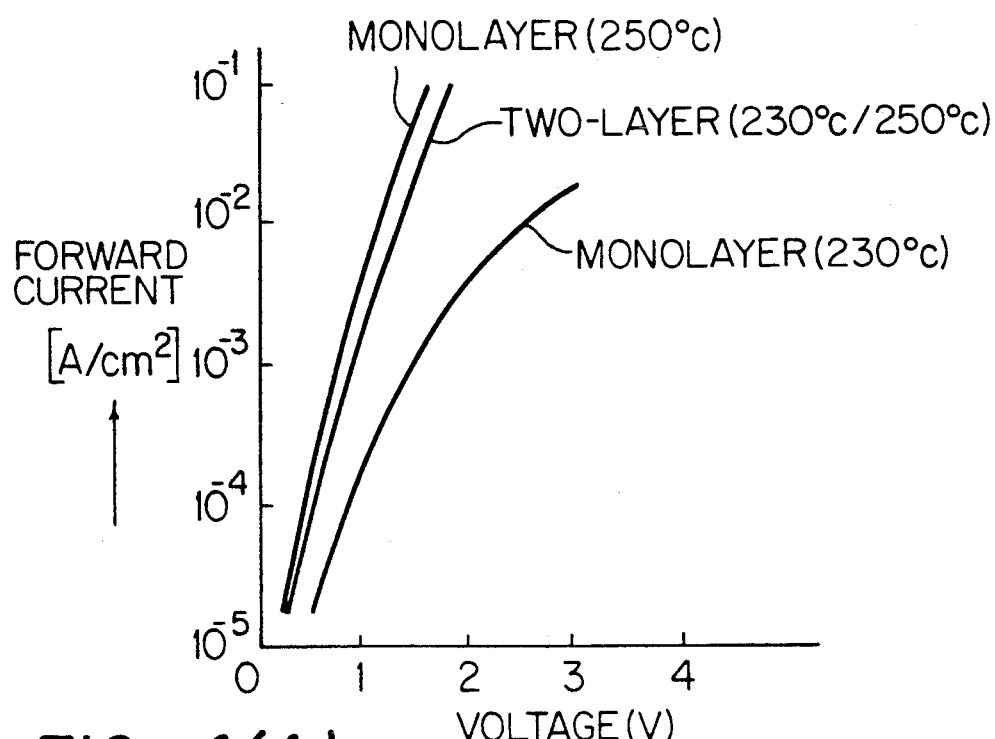
FIGS. 4(A) and 4(B) are graphical representations depicting the forward current characteristics and the reverse current characteristics respectively, of a photodiode fabricated according to the present invention having two hydrogenated amorphous silicon layers deposited at different substrate temperatures, in comparison with those characteristics for two other photodiodes each having a single non-doped hydrogenated amorphous silicon layer deposited, one at 230° C., the other at 250° C.

In FIG. 4(A), the x-axis shows the forward bias voltage (V) applied to, and the y-axis shows the forward current flow (A/cm2) in, the photodiodes. As can be seen in FIG. 4(A), the forward current characteristics of the photodiode of the first embodiment are somewhat lower than those of the photodiode having a mono-layered photoelectric conversion layer deposited at a temperature of 250° C., but much higher than those of the photodiode having a mono-layered photoelectric conversion layer deposited at a temperature of 230° C.

Figure 4B:
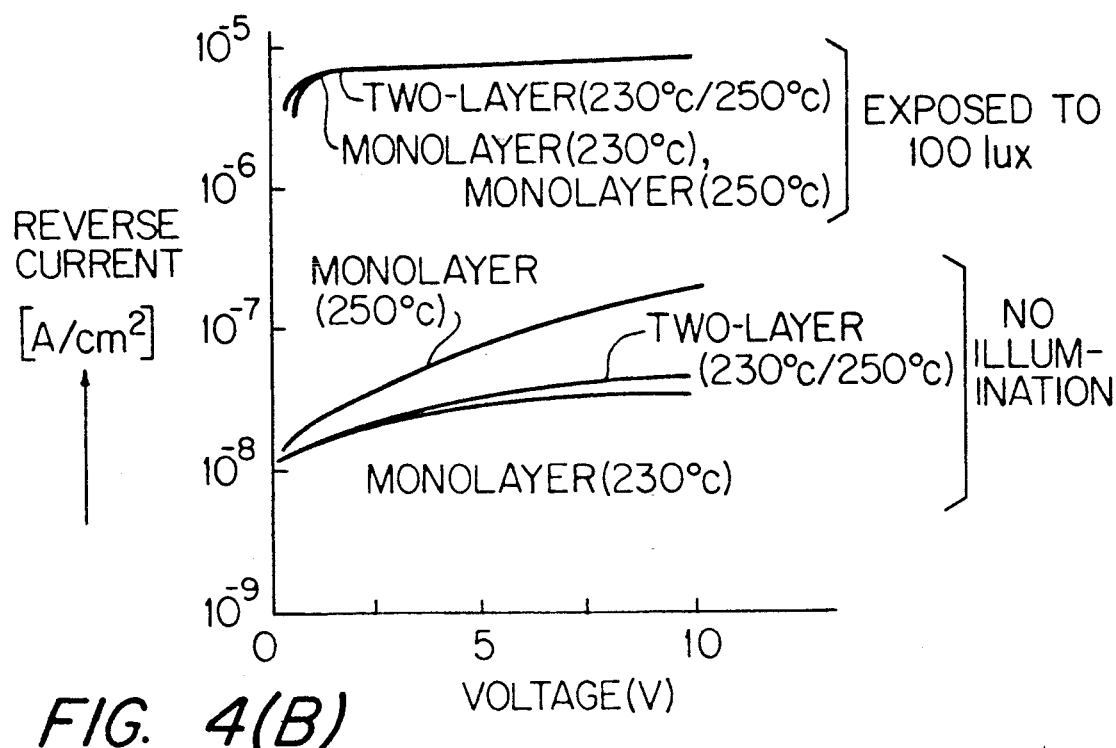

In FIG. 4(B), the x-axis show the reverse bias voltage (V) applied to, and the y-axis shows the reverse current flow (A/cm2) in, the photodiodes. When the photodiodes are illuminated at 100 lux (550 nm), the reverse current characteristics of the photodiode of the first embodiment are substantially the same as those of the two others. When not illuminated, however, the reverse current characteristics of the photodiode of the first embodiment are much lower than those of the photodiode having a mono-layered photoelectric conversion layer deposited at a temperature of 250° C., and very close to those of the photodiode having a mono-layered photoelectric conversion layer deposited at a temperature of 230° C.

As will be understood from these figures, the photodiode of the first embodiments has a larger forward current flow and a smaller dark current in the reverse direction than the others having mono-layered photoelectric conversion layers. That is, the photodiode of the first embodiment has been improved in both the forward current characteristic and the reverse current characteristic, resulting in improving the photo- to dark current ratio.

The image sensor configured according to the first embodiment operates as follows. As shown in FIG. 5, the shift register 16 sequentially transmits activating pulse voltages P to the pairs of photodiodes PD1 and PD2 connected to each other in series-opposition, to cause the photodiodes PD2 to be forward-biased and the photodiodes PD1 to be reverse-biased. For each pair, the forward-biased photodiode PD2 has a large forward current flow as mentioned above, so that the capacitance CP1 of the photodiode PD1 is sufficiently charged in the polarity shown in the figure. After the end of the pulse application, the electric charge in the capacitance CP1 is distributed to the capacitance CP2 of the photodiode PD2 and stored therein in the polarity shown in the figure.

Light from an original illuminates each pair of photodiodes PD1 and PD2, to generate electric currents therein according to the quantities of the received light. The electric currents flowing from the photodiodes PD1 and PD2 discharge the capacitances CP1 and CP2 according to the quantities of the photocurrents. After exposure, i.e. when no longer illuminated, the capacitances CP1 and CP2 scarcely discharge, because the photodiodes PD1 and PD2 have small dark currents in the reverse direction as discussed above, which preserves the electric charge in the capacitances CP1 and CP2. Another voltage pulse P is then transmitted from the shift register 16 to each pair of photodiodes in turn, to cause the capacitance CP1 to be sufficiently charged again. This charging varies the voltage on the load resistance R, which is detected by the output terminal T as an image signal.

Figure 6:
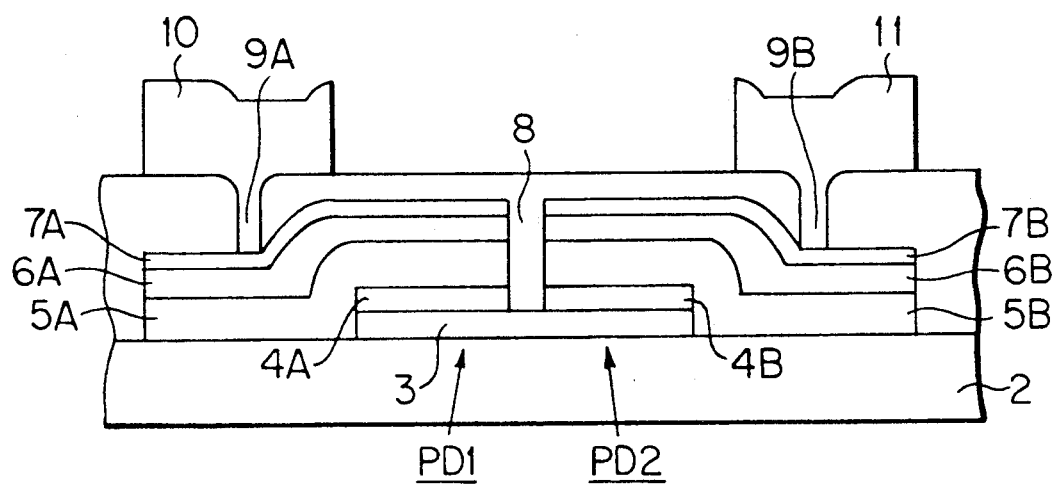
FIG. 6 is a cross-sectional view of a pair of photodiodes of a second embodiment of the image sensor according to the present invention.
Figure 7:
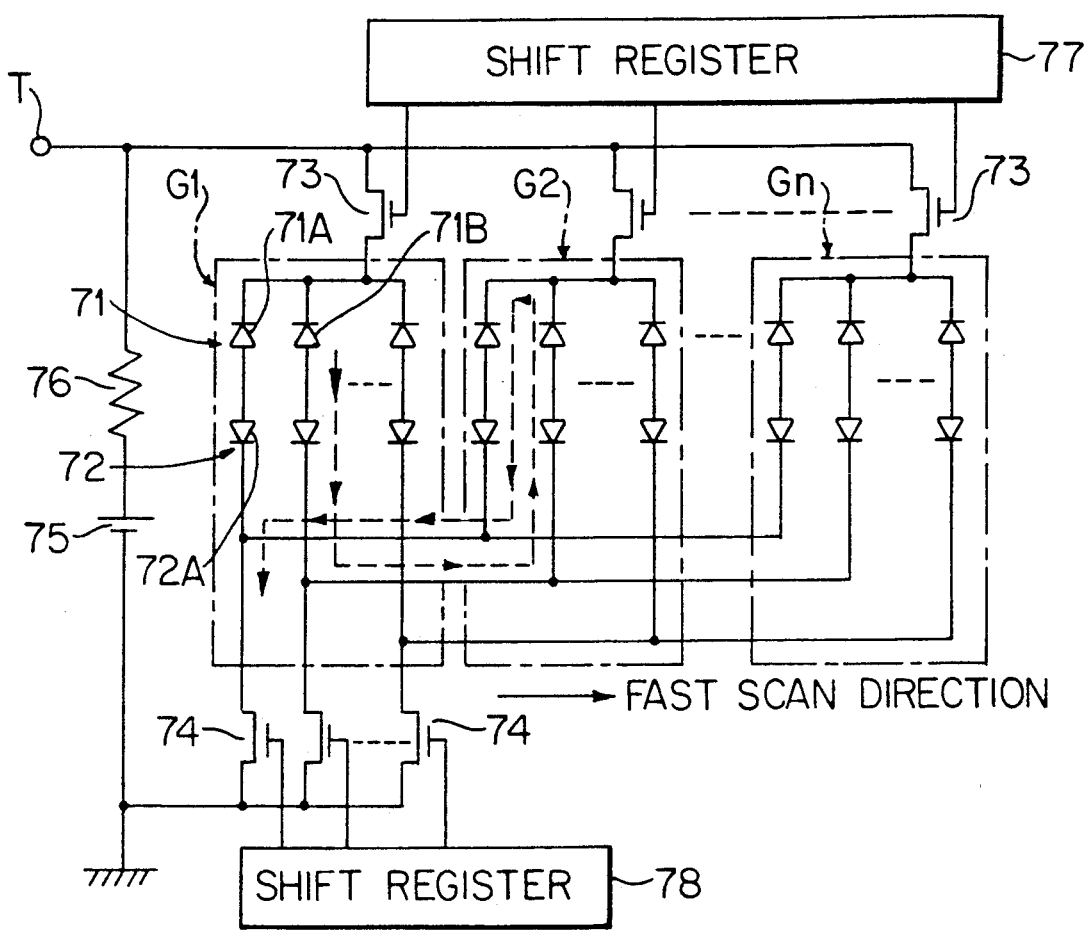
FIG. 7 is a circuit diagram of a conventional image sensor.
Figure 8:
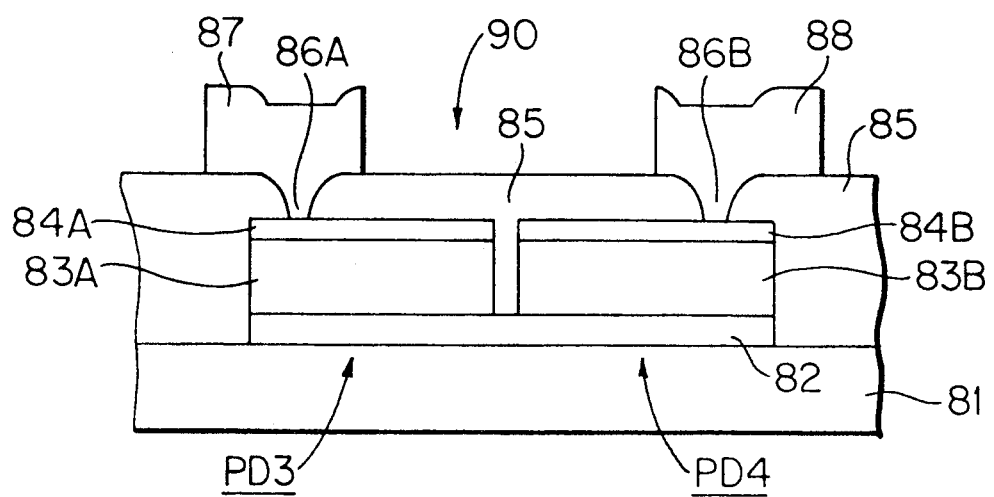
FIG. 8 is a cross sectional view of a pair of photodiodes of another conventional image sensor.

FIG. 6 shows a second embodiment of the present invention, which is a variation of the first embodiment discussed above, in which first non-doped hydrogenated amorphous silicon layers 5A and 5B, second non-doped hydrogenated amorphous silicon layers 6A and 6B, second non-doped and 7B are laminated over n-type doped hydrogenated amorphous silicon layers 4A and 4B and some portions of transparent electrode 2. The configuration is otherwise substantially the same as shown in FIG. 1. This image sensor also exhibits good characteristics equivalent to those of the first embodiment.

What is claimed is:

1. An image sensor comprising:
    a transparent substrate;
    a plurality of photoreceptor elements arranged in rows on the transparent substrate, each of said photoreceptor elements comprising:
    a first photodiode, and
    a second photodiode directly connected to said first photodiode in series, with opposition polarity,
    wherein at least one of said first photodiode and said second photodiode has a multilayered photoelectric conversion region of hydrogenated amorphous silicon, said photoelectric conversion region including,
        a first non-doped hydrogenated amorphous silicon layer, and
        a second non-doped hydrogenated amorphous silicon layer;
    a detecting circuit connected to said first photodiode of each of said photoreceptor elements; and
    a pulse generating circuit connected to said second photodiode of each of said photoreceptor elements.

2. An image sensor according to claim 1 wherein said first non-doped hydrogenated amorphous silicon layer is structured substantially to block reverse current and said second non-doped hydrogenated amorphous silicon layer is structured to enable substantial forward current.

3. An image sensor according to claim 1 wherein said first non-doped hydrogenated amorphous silicon layer is deposited at a lower temperature than said second non-doped hydrogenated amorphous silicon layer.

4. A method of fabricating an image sensor comprising the steps of:
    forming an electrode layer on a transparent substrate;
    forming a first hydrogenated amorphous silicon layer on said first electrode layer by a plasma CVD method;
    forming a second hydrogenated amorphous silicon layer on said first hydrogenated amorphous silicon layer by a plasma CVD method at a different temperature from that of said first hydrogenated amorphous silicon layer; and
    removing portions of said first and second hydrogenated amorphous silicon layers so as to yield pairs of photodiodes in direct electrical contact with each other in series opposition through said electrode layer.

5. A method of fabricating an image sensor according to claim 4 further comprising the step of forming an n-type doped hydrogenated amorphous silicon layer between said first electrode layer and said first hydrogenated amorphous silicon layer, wherein portions of said n-type doped hydrogenated amorphous silicon layer are removed at said step of removing of said first and second hydrogenated amorphous silicon layers.

* * * * *